United States Patent [19]

Sano et al.

[11] Patent Number: 5,395,457
[45] Date of Patent: Mar. 7, 1995

[54] PHOTOVOLTAIC DEVICE AND METHOD OF MANUFACTURING THE SAME

[75] Inventors: Keiichi Sano, Moriguchi; Satoshi Ishida, Neyagawa, both of Japan

[73] Assignee: Sanyo Electric Co., Ltd., Osaka, Japan

[21] Appl. No.: 153,351

[22] Filed: Nov. 12, 1993

[30] Foreign Application Priority Data

Dec. 16, 1992 [JP] Japan .................................. 4-336257
Dec. 25, 1992 [JP] Japan .................................. 4-346227

[51] Int. Cl.⁶ .................. H01L 31/04; H01L 31/0224; H01L 31/075; H01L 31/18
[52] U.S. Cl. ..................................... 136/256; 136/258; 257/459; 257/740; 437/2; 437/4
[58] Field of Search ......... 136/256, 258 AM, 258 PC, 136/261; 437/2-5, 180-181; 257/740, 459

[56] References Cited

U.S. PATENT DOCUMENTS 4,633,033 12/1986 Nath et al. ........................ 136/256
5,112,409 5/1992 Warfield et al. .................... 136/256
5,213,628 5/1993 Noguchi et al. .................... 136/255

FOREIGN PATENT DOCUMENTS 58-39073 3/1983 Japan .................................. 136/256
61-268072 11/1986 Japan .................................. 136/256

OTHER PUBLICATIONS

A. Wang, et al., *Appl. Phys. Lett.* vol. 57(6), "24% efficient silicon solar cells", Aug. 6, 1990, pp. 602–604.

*Primary Examiner*—Aaron Weisstuch
*Attorney, Agent, or Firm*—W. G. Fasse; W. F. Fassse

[57] ABSTRACT

A photovoltaic device having a tab soldered onto it for modularization, includes a first conductivity type crystalline semiconductor layer, a collector electrode electrically connected to the tab by soldering, a short-preventing layer formed under a soldered portion of the collector electrode, and a second, opposite conductivity type amorphous semiconductor layer formed above the crystalline semiconductor layer. The short-preventing layer is an insulating layer of $SiO_2$ or the like, or an opposite conductivity type doped layer formed in the first conductivity type crystalline semiconductor layer.

17 Claims, 10 Drawing Sheets

MODULE CONVERSION EFFICIENCY (%)

MODULE CONVERSION EFFICIENCY (%)

PHOTOVOLTAIC DEVICE AND METHOD OF MANUFACTURING THE SAME

BACKGROUND OF THE INVENTION

1. Field of the Invention

The present invention relates to a photovoltaic device, and more particularly, it relates to a photovoltaic device having a heterojunction which is formed by combining crystalline and amorphous semiconductor materials with each other.

2. Description of the Background Art

In recent years, active studies have been made on a photovoltaic solar cell device which is prepared from polycrystalline silicon. In particular, a solar cell having a heterojunction formed by combining amorphous and polycrystalline silicon materials with each other is receiving interest in view of its low cost and high conversion efficiency.

A plurality of such photovoltaic devices are generally connected in series with each other, in order to attain a sufficient voltage. A structure obtained by connecting such a plurality of photovoltaic devices in series with each other is generally called a module. Tabs are employed for connecting collector electrodes of the photovoltaic devices with each other by soldering, thereby modularizing the devices.

When a plurality of photovoltaic devices are electrically connected with each other by such tabs, however, certain characteristics of these devices may be disadvantageously changed by heat which is applied for soldering. Namely, amorphous semiconductor layers may be crystallized by heating thereby causing cracking, for example, leading to penetration of the metal that forms the collector electrodes and the like through the resulting cracks. Consequently, the cells may be shorted thereby damaging or disrupting p-n junctions therein.

While a photovoltaic device is generally provided with a collector electrode in a final step, it not possible to apply ordinary hot sintering silver paste to a heterojunction type photovoltaic device having an amorphous silicon layer, which is inferior in heat resistance. In such a photovoltaic device having an amorphous silicon layer, therefore, a collector electrode is with through low-temperature setting silver paste or by patterning of deposited silver. However, the low-temperature setting silver paste has disadvantages such as a high resistance and inferior characteristics. When the collector electrode is formed by patterning of deposited silver, on the other hand, the cost is increased since the number of steps is increased and a number of materials are required.

SUMMARY OF THE INVENTION

A principal object of the present invention is to provide a photovoltaic device and a method of manufacturing the same, which can improve the yield in modularization with no damage to or disruption of the p-n junction through soldering of a tab.

Another object of the present invention is to provide a method of manufacturing a photovoltaic device, which can manufacture a collector electrode having excellent characteristics at a low cost.

A photovoltaic device according to the present invention comprises a first conductivity type crystalline semiconductor layer, a collector electrode which is electrically connected with a tab by soldering, a short-preventing layer which is formed under a soldered portion of the collector electrode, and a second opposite conductivity type amorphous semiconductor layer which is formed above the crystalline semiconductor layer.

According to a first aspect of the present invention, an insulating layer is formed as the short-preventing layer.

A photovoltaic device according to the first aspect of the present invention comprises a first conductivity type crystalline semiconductor layer, a collector electrode which is electrically connected with a tab by soldering, an insulating layer which is formed on a surface or in the interior of a portion of the crystalline semiconductor layer located under a soldered portion of the collector electrode, and a second, opposite conductivity type amorphous semiconductor layer which is directly or indirectly formed on the crystalline semiconductor layer.

In the first aspect of the present invention, the insulating layer is formed on the surface or in the interior of the portion of the crystalline semiconductor layer which is located under the soldered portion of the collector electrode. In order to form the insulating layer on the surface portion of the crystalline semiconductor layer, it is possible to form a film for selectively or entirely defining the insulating layer on the surface and thereafter, remove an unnecessary portion by etching or the like.

The insulating layer may be prepared from an oxide such as silicon oxide or aluminum oxide, or a nitride or a carbide such as amorphous silicon nitride or amorphous silicon carbide. When amorphous silicon nitride or amorphous silicon carbide is employed, its composition ratio preferably differs from the stoichiometric composition ratio, so that it can be etched with hydrofluoric acid.

The insulating layer can be formed by a method such as sputtering or CVD, or by applying paste and thereafter firing the same. When an oxide is employed, the insulating layer can be formed by forming an oxide layer by thermal oxidation and removing an unnecessary portion by etching or the like. Alternatively, a prescribed portion of the crystalline semiconductor layer may be irradiated with a laser beam under an oxygen atmosphere, so that an oxide layer is formed in its interior.

The crystalline semiconductor layer may be prepared from a polycrystalline or single-crystalline semiconductor. Alternatively, a microcrystalline semiconductor may be employed.

In the first aspect of the present invention, an amorphous semiconductor layer may be interposed between the insulating layer and the collector electrode. For example, it is possible to form such an amorphous semiconductor layer after the insulating layer is formed on a prescribed portion, so that a transparent conductor film is formed thereon and the collector electrode is provided above the insulating layer. In this case, the amorphous semiconductor layer and the transparent conductor film are interposed between the collector electrode and the insulating layer.

Alternatively, the collector electrode may be directly formed on the insulating layer. In this case, the collector electrode is formed on the insulating layer after the insulating layer is formed on a prescribed portion, of the crystalline semiconductor layer and then an amorphous semiconductor layer and a transparent conductor film are successively formed on the collector electrode. The transparent conductor layer and the collector electrode must be at least partially electrically connected with each other.

In the first aspect of the present invention, the second, opposite conductivity type amorphous semiconductor layer is directly or indirectly provided on the first conductivity type crystalline semiconductor layer, to form a p-n junction. An intrinsic amorphous semiconductor layer may be formed between the crystalline semiconductor layer and the opposite conductivity type amorphous semiconductor layer.

Second and third aspects of the present invention are directed to methods of manufacturing the photovoltaic device according to the first aspect of the present invention.

The method according to the second aspect of the present invention comprises a step of forming an insulating layer on a prescribed portion of a first conductivity type crystalline semiconductor layer, a step of forming a collector electrode on the insulating layer, and a step of thereafter directly or indirectly forming a second opposite conductivity type amorphous semiconductor layer on the crystalline semiconductor layer.

On the other hand, the method according to the third aspect of the present invention comprises a step of forming an insulating layer on a prescribed portion of a first conductivity type crystalline semiconductor layer, a step of directly or indirectly forming a second, opposite conductivity type amorphous semiconductor layer on the crystalline semiconductor layer, and a step of forming a collector electrode above a portion of the amorphous semiconductor layer which is provided on the insulating layer.

In the photovoltaic device according to the first aspect of the present invention, the insulating layer is formed on the surface or in the interior of the portion of the crystalline semiconductor layer which is located under the soldered portion of the collector electrode. Due to such provision of the insulating layer, it is possible to prevent the cell from incurring a short circuit. When a tab is soldered onto the collector electrode, the amorphous semiconductor layer may suffer cracking or the like due to the heating. Even if metals forming the collector electrode and the tab penetrate along the resulting cracks, however, the insulating layer prevents the metals from penetrating into the crystalline semiconductor layer, thereby preventing the cell from incurring a short circuit.

In the method according to the second aspect of the present invention, the second, opposite conductivity type amorphous semiconductor layer is formed after the formation of the collector electrode. Therefore, it is possible to apply high-temperature sintering silver paste for forming the collector electrode, without the need of considering thermal damage to the amorphous semiconductor layer. Thus, it is possible to form a collector electrode having low resistance and excellent characteristics at a low cost. Also when a tab is soldered to the collector electrode by heating, the cell is prevented from incurring a short circuit due to the insulating layer which is provided on the crystalline semiconductor layer, similarly to the case of the first aspect of the present invention.

According to the third aspect of the present invention, the collector electrode is formed above the portion of the amorphous semiconductor layer which is located on the insulating layer, whereby it is possible to prevent the cell from incurring a short circuit during soldering of the tab, similarly to the first aspect of the present invention, thereby providing a photovoltaic device which can improve the yield in modularization.

In a fourth aspect of the present invention, a second, opposite conductivity type doped layer is formed in a first conductivity type crystalline semiconductor layer to serve as a short-circuit preventing layer.

A photovoltaic device according to the fourth aspect of the present invention comprises a first conductivity type crystalline semiconductor layer, second opposite conductivity type amorphous semiconductor layer which is directly or indirectly formed on the crystalline semiconductor layer, a collector electrode which is formed above the crystalline semiconductor layer to be soldered with a tab, and second, opposite conductivity type doped layer which is at least formed in a portion of the crystalline semiconductor layer located under a soldered portion of the collector electrode.

The second, opposite conductivity type amorphous semiconductor layer may be directly formed on the first conductivity type crystalline semiconductor layer, or an intrinsic amorphous semiconductor layer may be formed between the first conductivity type crystalline semiconductor layer and the opposite conductivity type amorphous semiconductor layer.

In the fourth aspect of the present invention, the crystalline semiconductor layer may be prepared from a polycrystalline or single-crystalline semiconductor.

According to the fourth aspect of the present invention, the second, opposite conductivity type doped layer is formed in the portion of the crystalline semiconductor layer which is located under the soldered portion of the collector electrode. This second, opposite conductivity type doped layer is preferably a high dopant concentration doped layer. Such a highly doped layer can be formed by laser doping, or by printing Al paste and thereafter annealing the same. When laser doping is employed, the doped layer is prepared by temporarily forming a high dopant concentration, opposite conductivity type, amorphous semiconductor layer on the crystalline semiconductor layer and thereafter irradiating the same with a laser beam for doping tile crystalline semiconductor layer with the dopant, or by irradiating the crystalline semiconductor layer with a laser beam in a gas atmosphere containing the dopant for forming the doped layer in the crystalline semiconductor layer, for example. When Al paste is employed, on the other hand, the Al paste is applied onto the crystalline semiconductor layer to be provided with a doped layer and then annealed so that Al is diffused into the crystalline semiconductor layer for forming the doped layer. After such formation of the doped layer, the surface may be etched to remove the layer of the Al paste, as the case may be.

In the fourth aspect of the present invention, the opposite conductivity type doped layer may simply be formed in the portion of the crystalline semiconductor layer which is located under the soldered portion of the collector electrode, without being formed under an unsoldered portion of the collector electrode. When it is desirable to form the doped layer also under the unsoldered portion of the collector electrode in view of the manufacturing steps, however, the doped layer may of course also be formed under the unsoldered portion.

According to the fourth aspect of the present invention, the opposite conductivity type doped layer is formed in the portion of the crystalline semiconductor layer which is located under the soldered portion of the collector electrode. Even if the amorphous semiconductor layer is cracked by soldering and a metal such as Al penetrates through the resulting cracks, therefore, the metal comes into contact with the opposite conductivity type doped layer. Since a p-n junction is maintained between the opposite conductivity type doped layer and the crystalline semiconductor layer, it is possible to prevent the p-n junction from being disrupted, contrary to the prior art.

While the opposite conductivity type doped layer is formed in the portion of the crystalline semiconductor layer which is located under the collector electrode, the provision of such a doped layer will not result in a large reduction of photoelectric conversion efficiency since this portion is covered by the collector electrode and receives only a small amount of incident light.

The foregoing and other objects, features, aspects, and advantages of the present invention will become more apparent from the following detailed description of the present invention when taken in conjunction with the accompanying drawings.

DESCRIPTION OF THE PREFERRED EMBODIMENTS

Figure 1:
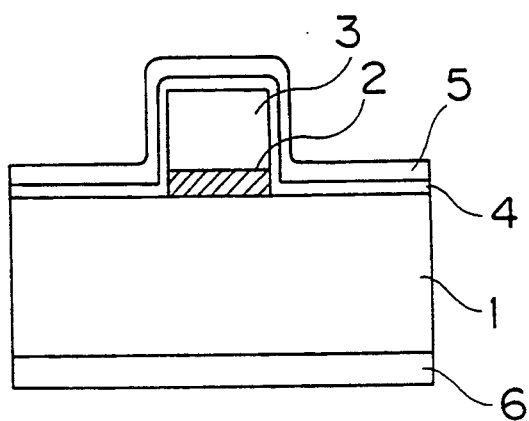
FIG. 1 is a sectional view showing an embodiment according to the first aspect of the present invention.

FIG. 1 is a sectional view showing an embodiment of a photovoltaic device according to the first aspect of the present invention, in which a collector electrode is directly formed on an insulating layer. Referring to FIG. 1, a silicon oxide layer 2 serving as an insulating layer is selectively provided on a prescribed portion of an n-type polycrystalline silicon substrate 1. The n-type polycrystalline silicon substrate 1 has a thickness of 300 $\mu$m, and a specific resistance of about 1 $\Omega$·cm. The silicon oxide layer 2 has a thickness of about 1000 to 2000 Å.

A collector electrode 3 is formed on the silicon oxide film 2. This collector electrode 3 is prepared by screen-printing high-temperature sintering silver paste and then sintering the same, to have a thickness of about 10 $\mu$m.

A p-type amorphous silicon layer 4 is formed on the n-type polycrystalline silicon substrate 1. The p-type amorphous silicon layer 4, which is about 100 Å in thickness, is also formed on the collector electrode 3. Further, a transparent electrode film 5 is formed on the p-type amorphous silicon layer 4. The transparent electrode film 5, which is about 700 Å in thickness, is prepared from ITO (indium tin oxide). A back electrode 6 is formed on a back surface of the n-type polycrystalline silicon substrate 1, with a thickness of 2 $\mu$m, by vapor deposition of aluminum.

In order to modularize the photovoltaic device shown in FIG. 1, a tab is soldered onto a portion of the transparent electrode film 5 which is provided on the collector electrode 3. Even if the transparent electrode film 5 and the p-type amorphous silicon layer 4 are thermally damaged at this time, the collector electrode 3 is provided under these layers while the silicon oxide layer 2 serving as an insulating layer is further provided under the collector electrode 3. Thus, it is possible to effectively prevent the cell from incurring a short circuit caused by heating during the soldering step.

In the photovoltaic device shown in FIG. 1, the collector electrode 3 must be electrically connected with the transparent electrode film 5. In general, the p-type amorphous silicon layer 4 is partially missing, i.e. has holes, when it is formed on the collector electrode 3, and hence the collector electrode 3 is electrically connected with the transparent electrode film 5 through such a missing portion or hole.

FIGS. 2A to 2E are sectional views showing an embodiment of a method according to the second aspect of the present invention, i.e. a method for manufacturing the photovoltaic device shown in FIG. 1.

Figure 2A:
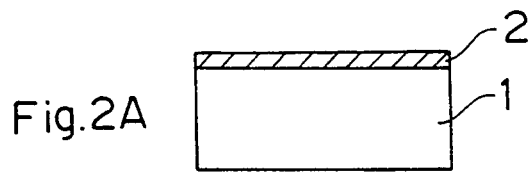
FIGS. 2A to 2E are sectional views showing an embodiment of a method according to the second aspect of the present invention for manufacturing the photovoltaic device shown in FIG. 1.

As shown in FIG. 2A, a silicon oxide layer 2 is formed entirely over an n-type polycrystalline silicon substrate 1. The silicon oxide layer 2 can be formed by sputtering under conditions of an Ar gas flow rate of 10 sccm, a pressure of $3 \times 10^{-3}$ Torr, a substrate temperature of 200° C. and a sputtering power of 2 W/cm$^2$, for example.

Figure 2B:
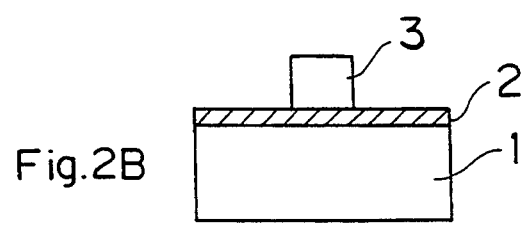

Then, a collector electrode 3 is formed on a prescribed portion of the silicon oxide layer 2, as shown in FIG. 2B. This collector electrode 3 is formed by screen-printing high-temperature sintering silver paste and thereafter sintering the same at a temperature of 550° C., for example.

Figure 2C:
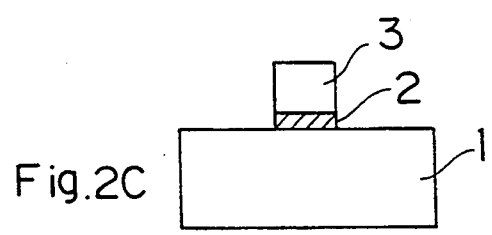

Then, the silicon oxide layer 2 is partially removed by etching with a solution containing hydrofluoric acid, to leave a portion located under the collector electrode 3, as shown in FIG. 2C.

Figure 2D:
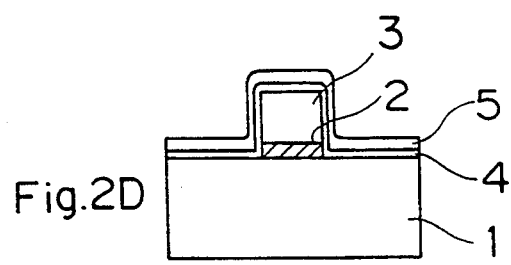

Then, a p-type amorphous silicon layer 4 is formed and then a transparent electrode film 5 is formed as shown in FIG. 2D.

Figure 2E:
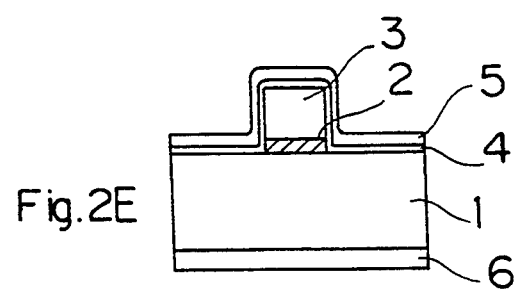

Then, a back electrode 6 is formed on a back surface of the n-type polycrystalline silicon substrate 1, as shown in FIG. 2E.

While the p-type amorphous silicon layer 4 is directly formed on the n-type polycrystalline silicon substrate 1 in the embodiments shown in FIGS. 1 and 2A to 2E, an intrinsic amorphous silicon layer may be formed on the n-type polycrystalline silicon substrate 1, so that the p-type amorphous silicon layer 4 is formed on this intrinsic amorphous silicon layer.

In the method according to this embodiment, the collector electrode 3 is formed in advance of the p-type amorphous silicon layer 4 and the transparent electrode film 5 which are susceptible to damage by heating. Thus, it is possible to form the collector electrode 3 by high-temperature sintering without considering the possible damaging influences of such a heating step. Thus, high-temperature sintering silver paste or the like can be employed to form a collector electrode 3 which has low resistance and excellent characteristics.

Figure 3:
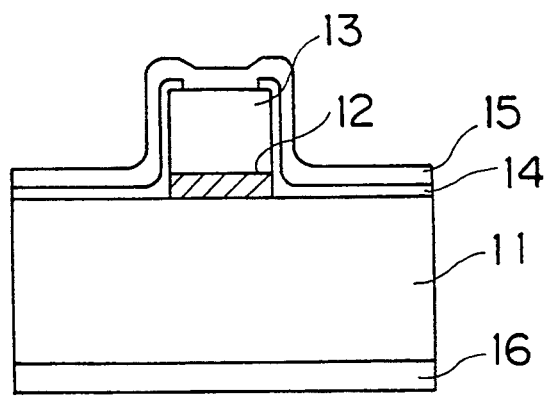
FIG. 3 is a sectional view showing another embodiment according to the first aspect of the present invention.

FIG. 3 is a sectional view showing a second embodiment of the photovoltaic device according to the first aspect of the present invention, in which a collector electrode is directly formed on an insulating layer. Referring to FIG. 3, a silicon oxide layer 12 is formed on a prescribed portion of an n-type polycrystalline silicon substrate 11. A collector electrode 13 is formed on this silicon oxide layer 12. A p-type amorphous silicon layer 14 is formed on the n-type polycrystalline silicon substrate 11, and on the collector electrode 13 except for except a part of the upper surface of the collector electrode 13. A transparent electrode film 15 is formed on this p-type amorphous silicon layer 14, in direct contact with and electrically connected to the collector electrode 13 on the upper surface portion thereof. A back electrode 18 is formed on the back surface of the n-type polycrystalline silicon substrate 11. The photovoltaic device according to this embodiment is formed in a substantially similar manner to that shown in FIG. 1, except that the p-type amorphous silicon layer 14 is partially removed from the upper surface of the collector electrode 13 so that the transparent electrode film 15 is directly in contact with the collector electrode 13. In other words, the transparent electrode film 15 is positively brought into electrical contact with the upper surface of the collector electrode 13 in the embodiment shown in FIG. 3.

FIGS. 4A to 4D are sectional views showing steps in another embodiment of the method according to the second aspect of the present invention for manufacturing the photovoltaic device shown in FIG. 3.

Figure 4A:
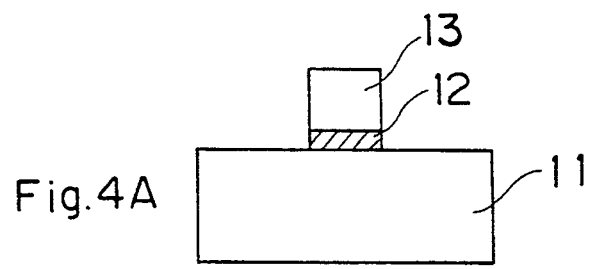
FIGS. 4A to 4D are sectional views showing another embodiment of the method according to the second aspect of the present invention for manufacturing the photovoltaic device shown in FIG. 3.
Figure 4B:
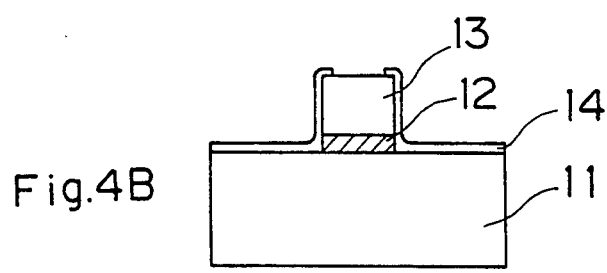

In FIG. 4A, silicon oxide layer 12 is formed on an n-type polycrystalline silicon substrate 11 and a collector electrode 13 is formed on the silicon oxide layer 12, by a step which is similar to that shown in FIG. 2C. A p-type amorphous silicon layer 14 is formed over the entire surface in this state. Thereafter the p-type amorphous silicon layer 14 is partially removed by laser pattern etching or photolithography to expose a part of the upper surface of the collector electrode 13. FIG. 4B shows this state.

Figure 4C:
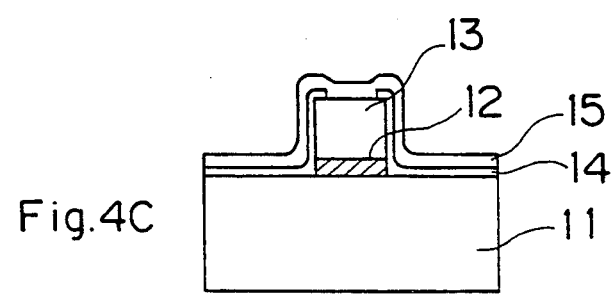

Then, a transparent electrode film 15 is formed thereon as shown in FIG. 4C, in contact with and electrically connected to the upper surface of the collector electrode 13.

Figure 4D:
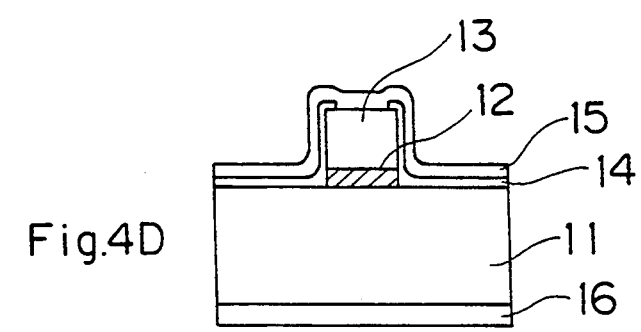

Then, a back electrode 16 is formed on the back surface of the n-type polycrystalline silicon substrate 11 as shown in FIG. 4D, in a similar manner to the embodiment shown in FIGS. 2A to 2E.

In the embodiments shown in FIGS. 3 and 4A to 4D, electrical contact between the collector electrode 13 and the transparent electrode film 15 is positively ensured. Also in these embodiments, the collector electrode 13 can be prepared from high-temperature sintering silver paste similarly to the embodiments shown in FIGS. 1 and 2A to 2E, whereby it will have low resistance and excellent characteristics. Also, when a tab is soldered to this photovoltaic device, it is possible to prevent the cell from incurring a short circuit, due to the silicon oxide layer 12 which is provided under the collector electrode 13.

Figure 5:
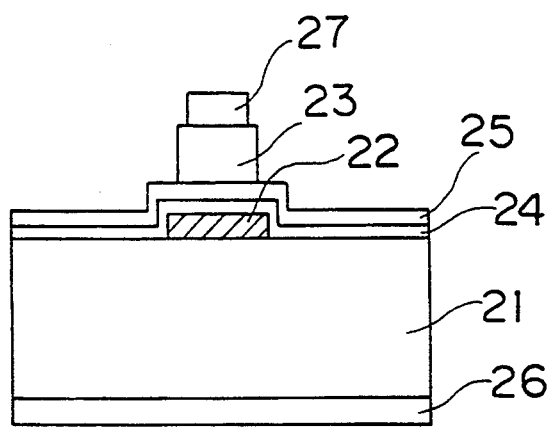
FIG. 5 is a sectional view showing still another embodiment according to the first aspect of the present invention.

FIG. 5 is a sectional view showing still another embodiment according to the first aspect of the present invention, in which an amorphous semiconductor layer is interposed between an insulating layer and a collector electrode. Referring to FIG. 5, a silicon oxide layer 22 is formed on a prescribed portion of an n-type polycrystalline silicon substrate 21. A p-type amorphous silicon layer 24 is formed on the n-type polycrystalline silicon substrate 21 to cover the silicon oxide layer 22, and a transparent electrode film 25 is further formed on the p-type amorphous silicon layer 24. A collector electrode 23 is formed on a portion of the transparent electrode film 25 which is located above the silicon oxide layer 22. A back electrode 26 is formed on the back surface of the n-type polycrystalline silicon substrate 21.

The silicon oxide layer 22, the p-type amorphous silicon layer 24, the transparent electrode film 25, the collector electrode 23 and the back electrode 26 are 10 μm, 100 Å, 700 Å, 30 μm and 2 μm in thickness, respectively, and formed in a similar manner to those of the embodiments shown in FIGS. 1 and 2A to 2E, respectively.

As shown in FIG. 5, a tab 27 is soldered onto the collector electrode 23 in the photovoltaic device which is formed in the aforementioned manner. Even if the p-type amorphous silicon layer 24 and the transparent electrode film 25 are cracked by heat during such soldering, it is possible to prevent the cell from incurring a short circuit, due to the silicon oxide layer 22 which is provided under these layers, thereby improving the yield in modularization.

Figure 6A:
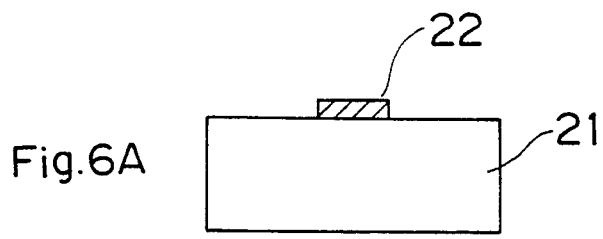
FIGS. 6A to 6C are sectional views showing an embodiment of a method according to the third aspect of the present invention fop manufacturing the photovoltaic device shown in FIG. 5.
Figure 6B:
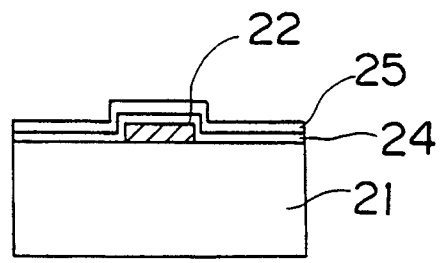
Figure 6C:
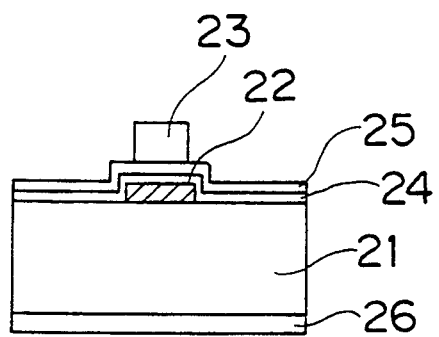

FIGS. 6A to 6C are sectional views showing steps of an embodiment of a method according to the third aspect of the present invention, for manufacturing the photovoltaic device shown in FIG. 5.

Referring to FIG. 6A, silicon oxide paste is applied onto an n-type polycrystalline silicon substrate 21 by screen printing, and fired at a temperature of about 500° C. for 1 hour, to form a silicon oxide layer 22.

Referring to FIG. 6B, a p-type amorphous silicon layer 24 and a transparent electrode film 25 are successively stacked and formed on the n-type polycrystalline silicon substrate 21 and the silicon oxide layer 22 by a method such as plasma CVD or sputtering.

Referring to FIG. 6C, a collector electrode 23 having a narrower width than the silicon oxide layer 22 is formed by silver paste on a portion of the transparent electrode film 25 which is located above the silicon oxide layer 22.

A tab is connected to the photovoltaic device which is prepared in the aforementioned manner, to modularize the same. Namely, the tab 27 is soldered onto the collector electrode 23, as shown in FIG. 5. Even with such soldering, it is possible to prevent the cell from short circuiting, due to presence of the silicon oxide layer 22, as hereinabove described.

As a practiced example, tabs were mounted on 11 samples of such cells by soldering, thus obtaining a yield of 10 cells having no short circuits. On the other hand, comparative samples were prepared by forming a p-type amorphous silicon layer 24 and a transparent electrode 25 on an n-type polycrystalline silicon substrate 21 without a silicon oxide layer 22, and forming a collector electrode 23 thereon in each sample, to determined a yield similarly to the above. As a result, only 5 samples had no short circuits among 10 such samples. Thus, it has been proved possible to improve the yield in tab mounting by forming an insulating layer at a position under a collector electrode according to the present invention.

Figure 7:
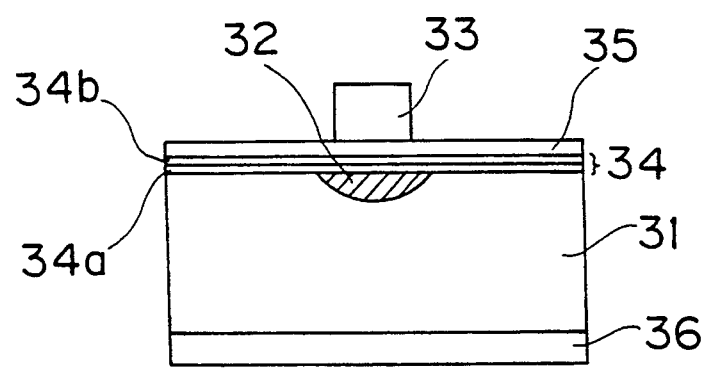
FIG. 7 is a sectional view showing a further embodiment according to the first aspect of the present invention.

While the insulating layer is formed on the crystalline semiconductor layer in each of the aforementioned embodiments, the insulating layer may alternatively be formed in the interior of the crystalline semiconductor layer. FIG. 7 is a sectional view showing such an embodiment. A silicon oxide layer 32 is formed so as to be embedded in a prescribed portion of an n-type polycrystalline silicon substrate 31. This silicon oxide layer 32 can be formed by irradiating the silicon substrate 31 with a laser beam and heating the same in an oxygen atmosphere, for example, thereby thermally oxidizing a part of the silicon substrate 31. After such formation of the silicon oxide layer 32, an amorphous silicon layer 34 is formed on the silicon substrate 31. This amorphous silicon layer 34 is formed by stacking an intrinsic amorphous Silicon layer 34a and a p-type amorphous silicon layer 34b. An ITO film is formed on this amorphous silicon layer 34, to provide a transparent electrode film 35. A collector electrode 33 is formed on a portion of the transparent electrode film 35 which is located above the silicon oxide layer 32.

A tab is mounted on the collector electrode 33 which is formed in the aforementioned manner by soldering. Even if the amorphous silicon layer 34 is heated and broken during such soldering, the cell is prevented from incurring a short due to the silicon oxide layer 32 which is provided under the amorphous silicon layer 34.

Even when a collector electrode is to be directly formed on an insulating layer similarly to the embodiments shown in FIGS. 1 to 4D, the insulating layer can be formed in a silicon substrate similarly to this embodiment, whereupon the collector electrode is directly provided on this insulating layer.

While the silicon substrate formed by a crystalline semiconductor layer is of an n type and the amorphous semiconductor layer which is formed above the same is of a p type in each of the aforementioned embodiments, the conductivity types may be reversed so that the silicon substrate is of a p type and the amorphous semiconductor layer is of an n type.

Further, while the insulating layer is formed on the surface or in the interior of the portion of the crystalline semiconductor layer which is located under the collector electrode in each of the aforementioned embodiments, such an insulating layer may be provided only at an area located under the soldered portion of the collector electrode, and not at an area located under an unsoldered portion of the collector electrode, if the cell is simply to be protected from incurring a short caused by heating during a soldering step.

In the photovoltaic device according to the first aspect of the present invention, the insulating layer may be formed on the surface or in the interior of the portion of the crystalline semiconductor layer which is located under the soldered portion of the collector electrode. In that case, even if the amorphous semiconductor layer is cracked by heat during soldering of the tab, it is possible to prevent penetration of metal which may short the cell. Thus, it is possible to prevent the cell from incurring a short.

The method according to the second aspect of the present invention is capable of manufacturing the photovoltaic device according to the first aspect of the present invention, in which the collector electrode is directly formed on the insulating layer. According to this method, it is possible to prepare the collector electrode from a hot firing paste as hereinabove described. Further, it is possible to prevent the cell from incurring a short also when a tab is mounted on the collector electrode by soldering after formation of the photovoltaic device.

The method according to the third aspect of the present invention is capable of manufacturing the photovoltaic device according to the first aspect of the present invention, in which an amorphous semiconductor layer is interposed between the insulating layer and the collector electrode. According to this method, it is possible to prevent the cell from incurring a short when a tab is soldered to the collector electrode.

Figure 8:
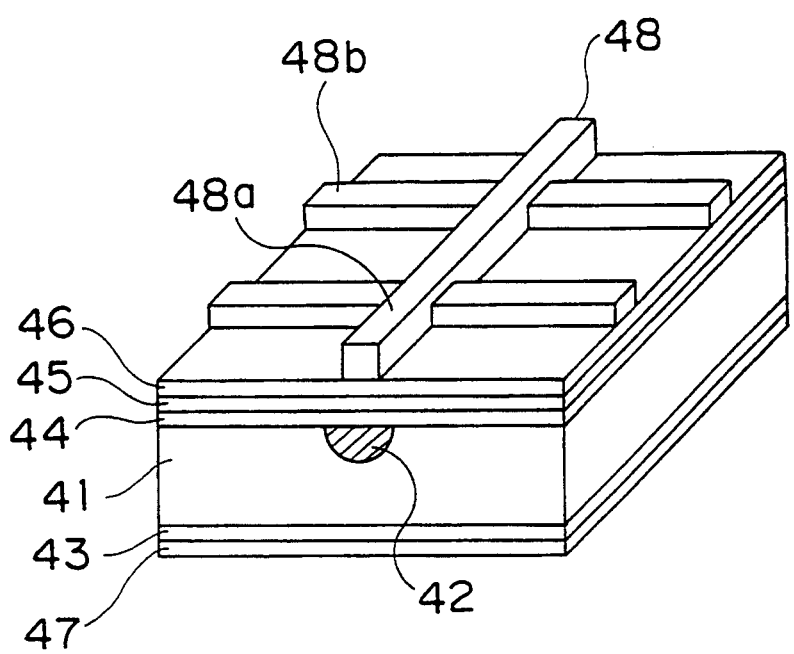
FIG. 8 is a perspective view showing an embodiment according to the fourth aspect of the present invention.

FIG. 8 is a perspective view showing an embodiment according to the fourth aspect of the present invention. Referring to FIG. 8, an intrinsic amorphous silicon film 44, a p-type amorphous silicon film 45, and a transparent conductor film 46 are successively stacked and formed on an n-type silicon substrate 41. A collector electrode 48 is provided on the transparent conductor film 46. This collector electrode 48 is formed by a bus bar 48a and branch electrodes 48b which are perpendicular to the bus bar 48a.

An $n^+$-type amorphous silicon film 43 is formed on the opposite surface of the silicon substrate 41, and a back electrode 47 is formed on this $n^+$-type amorphous silicon film 43.

As shown in FIG. 8, a $p^+$-type doped layer 42 is formed in a surface portion of the silicon substrate 41 which is located under a portion of the bus bar 48 soldered with a tab. Even if the transparent conductor film 46, the p-type amorphous silicon film 45, and the intrinsic amorphous silicon film 44 are cracked by heat which is applied during soldering and a metal such as Al penetrates through the resulting cracks, this metal comes into contact with the $p^+$-type doped layer 42. The $p^+$-type doped layer 42 and the n-type silicon substrate 41 form a p-n junction, which is not broken.

Figure 9A:
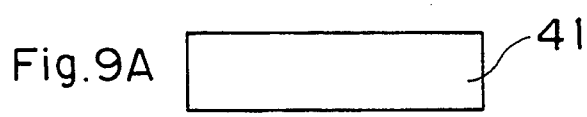
FIGS. 9A to 9F are sectional views showing steps of manufacturing the photovoltaic device shown in FIG. 8.
Figure 9B:
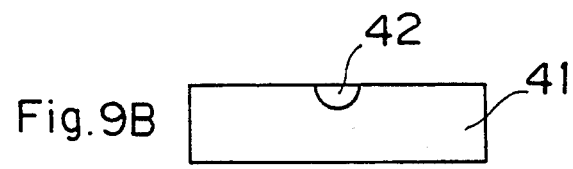

FIGS. 9A to 9F are sectional views showing steps of manufacturing the photovoltaic device shown in FIG. 8. First, a $p^+$-type doped layer 42 shown in FIG. 9B is formed in a prescribed portion of an n-type silicon substrate 41 shown in FIG. 9A. As hereinabove described, this doped layer 42 can be prepared by forming a $p^+$-type amorphous silicon film on the silicon substrate 41, irradiating a prescribed portion of the film with a laser beam for forming the doped layer 42 and thereafter removing the $p^+$-type amorphous silicon film by etching or the like, or alternatively by irradiating the film with a laser beam in a gas atmosphere containing a dopant such as boron (B) for forming the doped layer 42, or alternatively by applying Al paste to a prescribed portion and annealing the same at a temperature of about 600° C., for example. According to this embodiment, the doped layer 42 is formed to a depth of about 5000 Å.

Figure 9C:
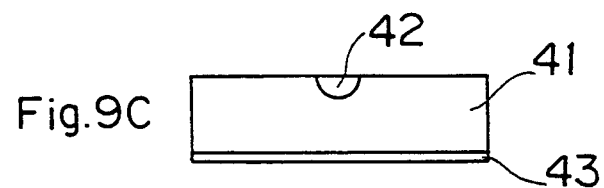

Then, an $n^+$-type amorphous silicon film 43 is formed on the back surface of the silicon substrate 41, as shown in FIG. 9C. According to this embodiment, the film 43 has a thickness of 400 Å.

Figure 9D:
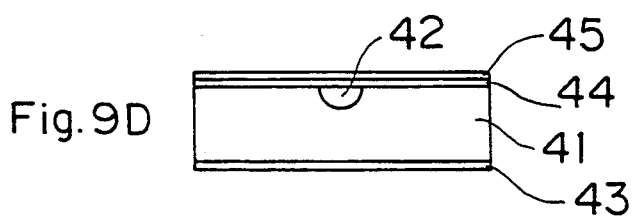

Then, an intrinsic amorphous silicon film 44 and a p-type amorphous silicon film 45 are successively stacked and formed on the surface of the silicon substrate 41, as shown in FIG. 9D. According to this embodiment, each of these films 44 and 45 is formed by plasma CVD at a temperature of 130° C., to a thickness of 50 Å.

Figure 9E:
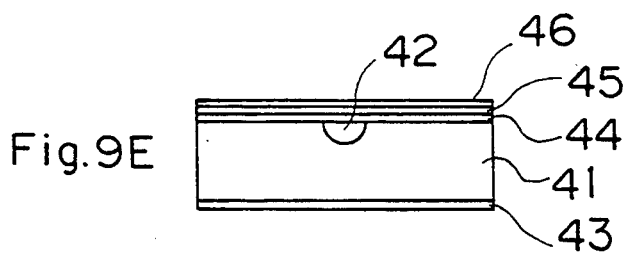

Then, a transparent conductor film 46 is formed on the p-type amorphous silicon film 45, as shown in FIG. 9E. According to this embodiment, the film 46 is prepared from an ITO film which is formed by sputtering to a thickness of 700 Å.

Figure 9F:
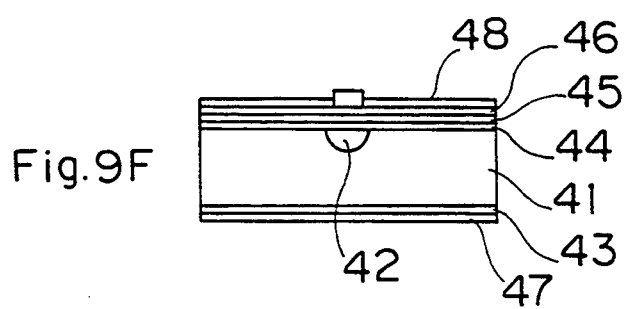

Then, a collector electrode 48 shown in FIG. 8 is formed on the transparent conductor film 46, as shown in FIG. 9F. According to this embodiment, the collector electrode 48 is made of Al.

Figure 10:
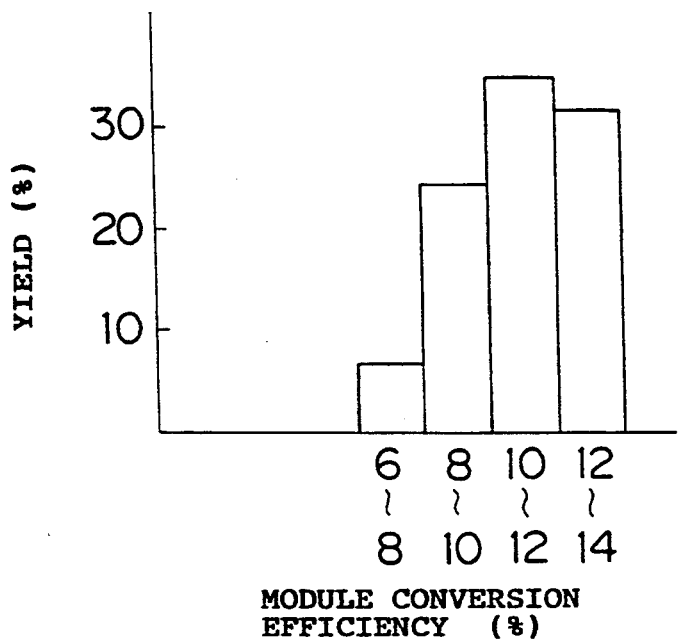
FIG. 10 illustrates the relation between module conversion efficiency and the yield in modularization of the embodiment according to the fourth aspect or,the present invention.
Figure 11:
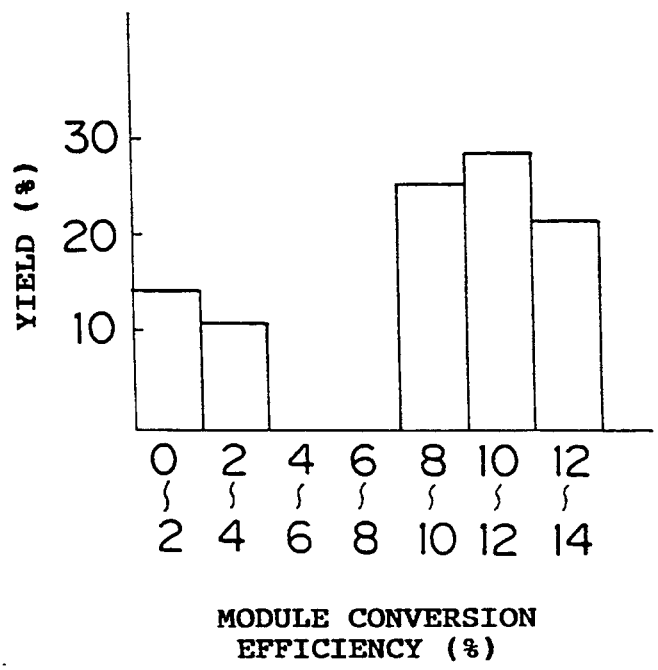
FIG. 11 illustrates the relation between module conversion efficiency and the yield in modularization of a comparative photovoltaic device.

As a practical example, a sample of the inventive photovoltaic device manufactured in the aforementioned manner was modularized to prepare a solar cell module, and the relation between conversion efficiency of such a solar cell module and its yield was determine. FIG. 10 shows the result. On the other hand, a comparative sample of a photovoltaic device was formed in a similar manner to the above except that no doped layer 42 was provided in the silicon substrate 41 and then a solar cell module was prepared therefrom. Also in this sample, the relation between conversion efficiency of such a solar cell module and its yield was determined similarly to the above. FIG. 11 Shows the result.

Comparing FIGS. 10 and 11 with each other, it is clearly understood that a solar cell module having high conversion efficiency can be obtained with a high yield, by using the inventive photovoltaic device which is provided with a doped layer in a position under a soldered portion of a collector electrode.

Although the doped layer 42 is of high dopant concentration in the aforementioned embodiment, it is not requisite to form this doped layer 42 with a high dopant concentration, but the same may simply be opposite in conductivity type relative to the crystalline semiconductor layer.

While the silicon substrate 41 formed by a crystalline semiconductor layer is of an n type in the aforementioned embodiment, it may alternatively be of a p type, so that an n-type semiconductor layer is formed above the substrate as an amorphous semiconductor layer.

Further, although the intrinsic amorphous silicon film 44 is formed between the silicon substrate 41 and the p-type amorphous silicon film 45 in the aforementioned embodiment, the p-type amorphous silicon film 45 nay alternatively be directly formed on the silicon substrate 41 without any intrinsic silicon film 44. Also while the n+-type amorphous silicon film 43 is formed on the back sur Face of the silicon substrate 41 in the embodiment, it is not necessary to form this n+-type amorphous silicon film 43.

In the photovoltaic device according to the fourth aspect of the present invention, the opposite conductivity type doped layer is formed in the portion of the crystalline semiconductor layer which is located under the soldered portion of the collector electrode. Even if the amorphous semiconductor layer is heated and cracked during soldering and a metal penetrates into the crystalline semiconductor layer through the resulting cracks, therefore, it is possible to prevent damage or disruption of the p-n junction since the metal comes into contact with the opposite conductivity type doped layer.

When the photovoltaic device according to the fourth aspect of the present invention is modularized, therefore, it is possible to obtain a solar cell module having high conversion efficiency with a high-yield of modularization.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device with a soldered tab for modularization, said photovoltaic device comprising: a first conductivity type crystalline semiconductor layer; a collector electrode electrically connected with said tab by solder at a soldered portion of said collector electrode; an insulating layer arranged under said soldered portion of said collector electrode; and a second, opposite conductivity type amorphous semiconductor layer arranged directly or indirectly on said crystalline semiconductor layer; wherein said collector electrode is arranged on said insulating layer and wherein said collector electrode and said insulating layer together are arranged between said crystalline semiconductor layer and said amorphous semiconductor layer.

2. The photovoltaic device of claim 1, wherein said insulating layer is arranged directly on a surface of said crystalline semiconductor layer.

3. The photovoltaic device of claim 1, wherein said insulating layer is arranged in the interior of said crystalline semiconductor layer.

4. The photovoltaic device of claim 1, wherein said collector electrode is arranged directly on said insulating layer.

5. The photovoltaic device of claim 1, wherein said insulating layer is also arranged under a portion of said collector electrode other than said soldered portion.

6. The photovoltaic device of claim 1, further comprising an intrinsic amorphous semiconductor layer arranged between said crystalline semiconductor layer and said opposite conductivity type amorphous semiconductor layer.

7. The photovoltaic device of claim 1, further comprising a transparent conductor film arranged on said amorphous semiconductor layer.

8. The photovoltaic device of claims 7, wherein said amorphous semiconductor layer has a hole adjacent said collector electrode, and wherein said transparent conductor film is electrically connected with said collector electrode through said hole.

9. A photovoltaic device with a soldered tab for modularization, said photovoltaic device comprising: a first conductivity type crystalline semiconductor layer; a collector electrode electrically connected with said tab by solder at a soldered portion of said collector electrode; an insulating layer arranged under said soldered portion of said collector electrode; and a second, opposite conductivity type amorphous semiconductor layer arranged directly or indirectly on said crystalline semiconductor layer; wherein said amorphous semiconductor layer is arranged on said insulating layer in a region provided with said insulating layer, said collector electrode being arranged directly or indirectly on said amorphous semiconductor layer at said region provided with said insulating layer.

10. The photovoltaic device of claim 9, wherein said insulating layer is also arranged under a portion of said collector electrode other than said soldered portion.

11. The photovoltaic device of claim 9, further comprising an intrinsic amorphous semiconductor layer arranged between said crystalline semiconductor layer and said opposite conductivity type amorphous semiconductor layer.

12. A method of manufacturing a photovoltaic device, comprising the following steps: forming an insulating layer on a portion of a first conductivity type crystalline semiconductor layer; forming a collector electrode on said insulating layer; and forming a second, opposite conductivity type amorphous semiconductor layer on said crystalline semiconductor layer after formation of said collector electrode.

13. A method of manufacturing a photovoltaic device, comprising the following steps: forming an insulating layer on a portion of a first conductivity type crystalline semiconductor layer; forming a second, opposite conductivity type amorphous semiconductor layer directly or indirectly on said crystalline semiconductor layer and on said insulating layer; and forming a collector electrode directly or indirectly on a portion of said amorphous semiconductor layer located directly or indirectly on said insulating layer.

14. A photovoltaic device with a soldered tab for modularization, said photovoltaic device comprising: a first conductivity type crystalline semiconductor layer; a second, opposite conductivity type amorphous semiconductor layer arranged directly or indirectly on said crystalline semiconductor layer; a collector electrode arranged directly or indirectly on said amorphous semiconductor layer and soldered onto said tab; and a second, opposite conductivity type doped layer arranged at least in a portion of said crystalline semiconductor layer located under a soldered portion of said collector electrode.

15. The photovoltaic device of claim 14, wherein said opposite conductivity type doped layer is also arranged in a portion of said collector electrode other than said soldered portion.

16. The photovoltaic device of claim 14, further comprising an intrinsic amorphous semiconductor layer arranged between said crystalline semiconductor layer and said opposite conductivity type amorphous semiconductor layer.

17. A method of manufacturing a photovoltaic device, comprising the following steps: forming a second, opposite conductivity type doped layer in a portion of a first conductivity type crystalline semiconductor layer; forming a second, opposite conductivity type amorphous semiconductor layer directly or indirectly on said crystalline semiconductor layer; and forming a collector electrode directly or indirectly on a portion of said amorphous semiconductor layer located directly or indirectly on said opposite conductivity type doped layer.

* * * * *

UNITED STATES PATENT AND TRADEMARK OFFICE
CERTIFICATE OF CORRECTION

PATENT NO. : 5,395,457

DATED : March 7, 1995

INVENTOR(S) : Sano et al.

It is certified that error appears in the above-identified patent and that said Letters Patent is hereby corrected as shown below:

Column 1, line 44, after "is" insert --formed--, delete "through".

Column 2, line 57, replace "so that" by --of the crystalline semiconductor layer, and then--;

line 66, after "portion" delete ",";

line 67, after "layer" insert --,--.

Column 3, line 22, after "second" insert --,--.

Column 4, line 11, after "layer," insert --a--;

line 36, delete "doped" (first occurrence);

line 44, replace "tile" by --the--.

Column 5, line 43, replace "fop" by --for--;

line 55, replace "or" by --of--.

Column 6, line 51, after "C." insert --,--.

Column 7, line 28, delete "except";

line 33, replace "18" by --16--;

line 49, before "silicon" insert --a--.

Column 8, line 11, replace "Showing" by --showing--;

line 30, after "and" insert --are--;

line 67, replace "practiced" by --practical--.

UNITED STATES PATENT AND TRADEMARK OFFICE
CERTIFICATE OF CORRECTION

PATENT NO. : 5,395,457

DATED : March 7, 1995

INVENTOR(S) : Sano et al.

It is certified that error appears in the above-identified patent and that said Letters Patent is hereby corrected as shown below:

Column  9, line  7, replace "mined" by --mine--;
            line 28, replace "Silicon" by --silicon--.

Column 11, line 23, replace "determine." by --determined.--;
            line 45, replace "n type" by --n-type--;
            line 46, replace "p type" by --p-type--;
            line 56, replace "sur Face" by --surface--;
            line 63, replace "$the_i$" by --the--.

Column 12, line  6, delete "of".

Column 12, Claim 8, claim line 50, replace "claims" by --claim--.

Signed and Sealed this

Thirtieth Day of May, 1995

Attest:

BRUCE LEHMAN

*Attesting Officer*        *Commissioner of Patents and Trademarks*